United States Patent [19]

Wynne

[11] Patent Number: 5,422,588

[45] Date of Patent: Jun. 6, 1995

[54] LOW DISTORTION CMOS SWITCH SYSTEM
[75] Inventor: John Wynne, Limerick, Ireland
[73] Assignee: Analog Devices Inc., Wilmington, Mass.
[21] Appl. No.: 76,456
[22] Filed: Jun. 14, 1993
[51] Int. Cl.[6] .................................... H03K 17/687
[52] U.S. Cl. .................................. 327/437; 327/427
[58] Field of Search ................ 307/571, 584, 585, 243, 307/304; 327/427, 434, 437, 407, 408, 581

[56] References Cited

U.S. PATENT DOCUMENTS 4,511,814 4/1985 Matsuo .......................... 307/572

FOREIGN PATENT DOCUMENTS

| 5928723 | 2/1984 | Japan | 307/571 |
| 0250520 | 2/1990 | Japan | 307/571 |
| 2116219 | 4/1990 | Japan | 307/571 |
| 3195213 | 8/1991 | Japan | 307/571 |
| 4273716 | 9/1992 | Japan | 307/571 |

Primary Examiner—William L. Sikes
Assistant Examiner—Tiep H. Nguyen
Attorney, Agent, or Firm—Joseph S. Iandiorio; Kirk Teska; Iandiorio & Teska

[57] ABSTRACT

A low distortion CMOS switch system includes a plurality of N-channel and a plurality of P-channel transistors with their drain and source terminals connected in parallel for receiving an input signal to be switched; and a control circuit for providing a different positive drive voltage to the gate of each of the N-channel transistors and a different negative drive voltage to the gate of each of the P-channel transistors to produce substantially constant "on" resistance, $R_{ON}$, throughout the range of the switched signal conducted through the drain and source terminals, and for providing the same negative drive voltage to the gate of each of the N channel transistors and the same positive drive voltage to the gate of each of the P channel transistors to turn off the transistors.

7 Claims, 6 Drawing Sheets

LOW DISTORTION CMOS SWITCH SYSTEM

FIELD OF INVENTION

This invention relates to a low distortion switch system, and more particularly to a CMOS switch system with more uniform "on" resistance.

BACKGROUND OF INVENTION

A single CMOS switch or a single channel of a CMOS multiplexer essentially consists of an N-channel and a P-channel MOSFET transistor in parallel. The respective drains and sources of the two transistors are tied together to become the switch terminals while the gates of the two transistors are usually driven with the power supply voltages, $V_{DD}$ and $V_{SS}$, to control the on-off action of the switch. Essentially the N-channel is ON for positive gate-to-source voltages and OFF for negative gate-to-source voltages (vice versa for the P-channel).

With a fixed voltage on the gate, the "on" resistance $R_{ON}$ of the complementary switch varies in proportion to the magnitude of the signal passing through the switch. When $R_{ON}$ is plotted against applied switch voltage $V_S$ ($V_D$), the resistance of the N-channel increases with positive voltage and the resistance of the P-channel increases with negative voltage. The resultant parallel combination exhibits the well-known "crown" or twin-peak characteristic. This variation in on-channel resistance with input signal is known as $R_{ON}$ modulation.

While a varying $R_{ON}$ or $\Delta R_{ON}$ can be tolerated in some applications, in others it cannot. One attempt to reduce the $\Delta R_{ON}$ employs physically larger transistors. While this approach does work, it has a number of shortcomings. The device is larger and it requires more silicon at greater expense. In addition it introduces greater interelectrode capacitance, which is unacceptable in many applications.

SUMMARY OF INVENTION

It is therefore an object of this invention to provide an improved low distortion switch system with a more uniform "on" resistance.

It is a further object of this invention to provide such a low distortion CMOS switch system with a more uniform "on" resistance.

It is a further object of this invention to provide such a switch system which does not require larger transistors or more silicon or introduce greater interelectrode capacitance.

The invention results from the realization that a more uniform "on" resistance, $R_{ON}$, can be obtained in CMOS and similar switch systems by employing a plurality of N-channel and P-channel transistors with their load terminals connected in parallel and their gates operated with different drive voltages.

This invention features a low distortion CMOS system including a plurality of N-channel and a plurality of P-channel transistors with their drain and source terminals connected in parallel for receiving an input signal to be switched. There is a control circuit for providing different positive drive voltages to the gates of each of the N-channel transistors and different negative drive voltages to the gates of each of the P-channel transistors to produce a more constant "on" resistance, $R_{ON}$, throughout the range of the switched signal conducted through the drain and source terminals, and for providing the same negative drive voltage to the gate of each of the N channel transistors and the same positive drive voltage to the gate of each of the P channel transistors to turn off the transistors.

In a preferred embodiment the control circuit may include a voltage divider circuit for providing the different positive and negative voltages for each of the gates of the transistors. The control circuit may also include switching means for applying the same positive and same negative voltages to the gates of the transistor to turn off the transistor.

More generally, the invention features a low distortion semiconductor switch which includes a plurality of N-channel and a plurality of P-channel semiconductors with their load terminals connected in parallel for receiving an input signal to be switched, and a control circuit for providing a different drive voltage to the gates of each of the P-channel and to the gates of each of the N-channel semiconductors to produce a more constant "on" resistance, $R_{ON}$, throughout the range of the switched signal conducted to the load terminals.

In a preferred embodiment the semiconductor switch is a CMOS switch and the semiconductors are transistors with their load terminals being drain and source terminals.

Other objects, features and advantages will occur to those skilled in the art from the following description of a preferred embodiment and the accompanying drawings, in which:

DESCRIPTION OF THE PREFERRED EMBODIMENT

Figure 1:
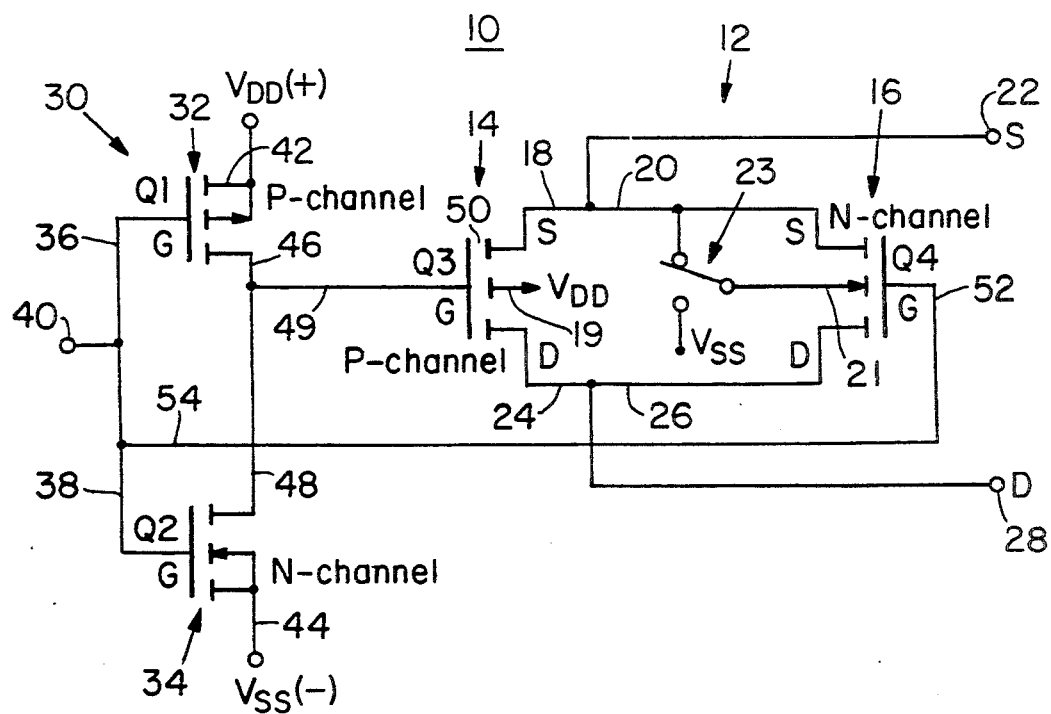
FIG. 1 is a schematic diagram of a conventional CMOS switch system.

There is shown in FIG. 1 a conventional CMOS switch system 10 including CMOS switch 12 having P-channel and N-channel CMOS transistors 14 and 16, respectively, connected in parallel with their sources connected together and providing one input 22 for the signal to be switched. Their drains 24, 26 are connected in parallel to form a second drain terminal 28 for the input signal to be switched. CMOS switch 12 is operated by drive circuit 30 which includes a pair of transistors 32 and 34, whose gates 36, 38 are connected in common to input terminal 40 which receives the switching signal. One terminal 42 of transistor 32 is connected to a positive power supply $V_{DD}$, for example +15 volts, and one terminal 44 of transistor 34 is connected to negative power supply $V_{SS}$, for example −15 volts. The other terminals 46, 48 are connected together and provide the drive input over line 49 to gate 50 of P-channel transistor 14. The drive input to gate 52 of N-channel 16 is provided on line 54 directly from input terminal 40. Typically the back gates 19, 21 may be connected to positive $V_{DD}$ and negative $V_{SS}$ biases.

Back gate 21 of the N channel transistor may be connected to source 20 in the on state and $V_{SS}$ in the off state by means of switch 23.

In operation, when the switching signal 40 is at 15 volts, transistor 34 is turned on. This drives terminal 46 and thus gate 50 to the −15 volt level at terminal 44, causing P-channel transistor 14 to conduct. At the same time the +15 volts on line 54 to gate 52 of transistor 16 causes that N-channel transistor to conduct. Transistor 32 is held off by the +15 volts on its gate 36. When the input signal 40 switches to −15 volts, transistor 34 is turned off and transistor 32 is turned on. This raises terminal 46 and gate 50 to $V_{DD}$, or +15 volts, turning off P-channel transistor 14. The −15 volts on line 54 is applied directly to gate 52 and thus turns off N-channel transistors 16. The input signal generally should not go more positive than $V_{DD}$ or more negative than $V_{SS}$. The input signals to be switched at terminals 22 and 28 are generally set so that they are less than the full peak-to-peak excursion of the supply voltage $V_{DD}-V_{SS}$. That is, they do not operate from rail to rail. With $V_{DD}$ and $V_{SS}$ set at +15 and −15, for example, the input voltages to be switched at terminals 22 and 28 may be limited to a +10 to −10 volt variation. Switch 12 in the "on" state exhibits a variation or modulation of its "on" resistance, $R_{ON}$, as a function of the magnitude of the signal to be switched on terminals 22 and 28.

Figure 2:
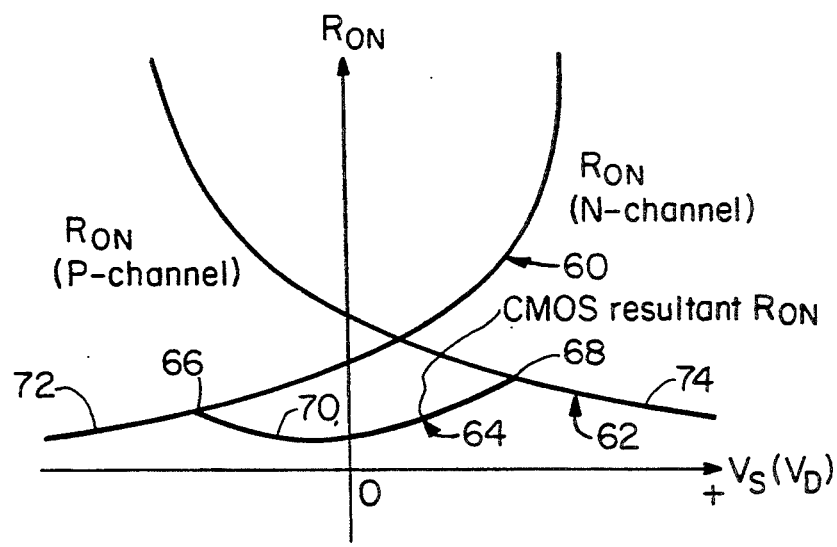
FIG. 2 is a graph illustrating the derivation of the crown or twin peak $R_{ON}$ characteristic.

Thus as can be seen in FIG. 2, while the "on" resistance for the N-channel 60 increases in the $+V_S$ direction and the "on" resistance for the P-channel transistor 62 increases in the $-V_S$ direction, the CMOS resultant $R_{ON}$ 64, the one referred to throughout this application, is actually a composite which exhibits the characteristic double peaks 66, 68 with a dip between them and the declining value of resistance on either side 72 and 74.

Figure 3A:
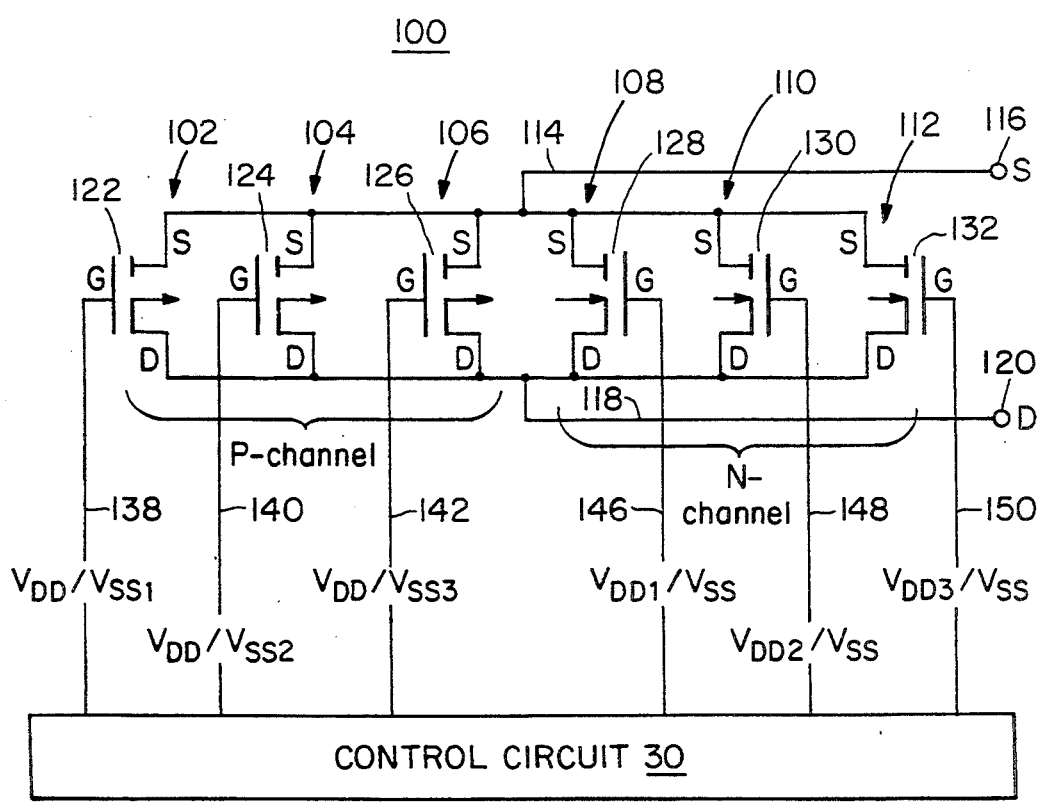
FIG. 3A is a schematic diagram of a low distortion CMOS switch system according to this invention.

In accordance with this invention, in order to reduce this modulation of $R_{ON}$ and reduce the difference or $\Delta R_{ON}$ 70 between the lowest value of the composite characteristic and the tops of the points 66 and 68, the switch system 100, FIG. 3A, according to this invention employs a plurality of P-channel transistors 102, 104 and 106, and a plurality of N-channel transistors 108, 110 and 112, all connected in parallel with their source terminals all connected over line 114 to source input terminal 116 and their drain terminals all connected in parallel over line 118 to drain terminal 120.

In accordance with this invention, each of the gates 122, 124, 126, 128, 130 and 132 of transistors 102, 104, 106, 108, 110 and 112, respectively, are supplied with the necessary drive voltages from drive circuit 30. A control circuit 30 provides a different voltage on each of the lines 138, 140, 142, 146, 148 and 150 to the respective gates 122, 124, 126, 128, 130 and 132. The results can be seen in FIGS. 4, 5 and 6.

Control circuit 130 provides a different positive drive voltage $V_{DD1}$, $V_{DD2}$, $V_{DD3}$ to the gate of each N channel transistor 108, 110 and 112 and a different negative drive voltage $V_{SS1}$, $V_{SS2}$, $V_{SS3}$ to the gate of each P channel transistor 102, 104 and 106.

Contact circuit 30 also provides the same voltage $V_{SS}$ to each gate of the N channel transistors 108, 110 and 112 to turn them off and the same voltage $V_{DD}$ to each gate of the P channel transistors 102, 104 and 106, to turn them off.

Figure 3B:
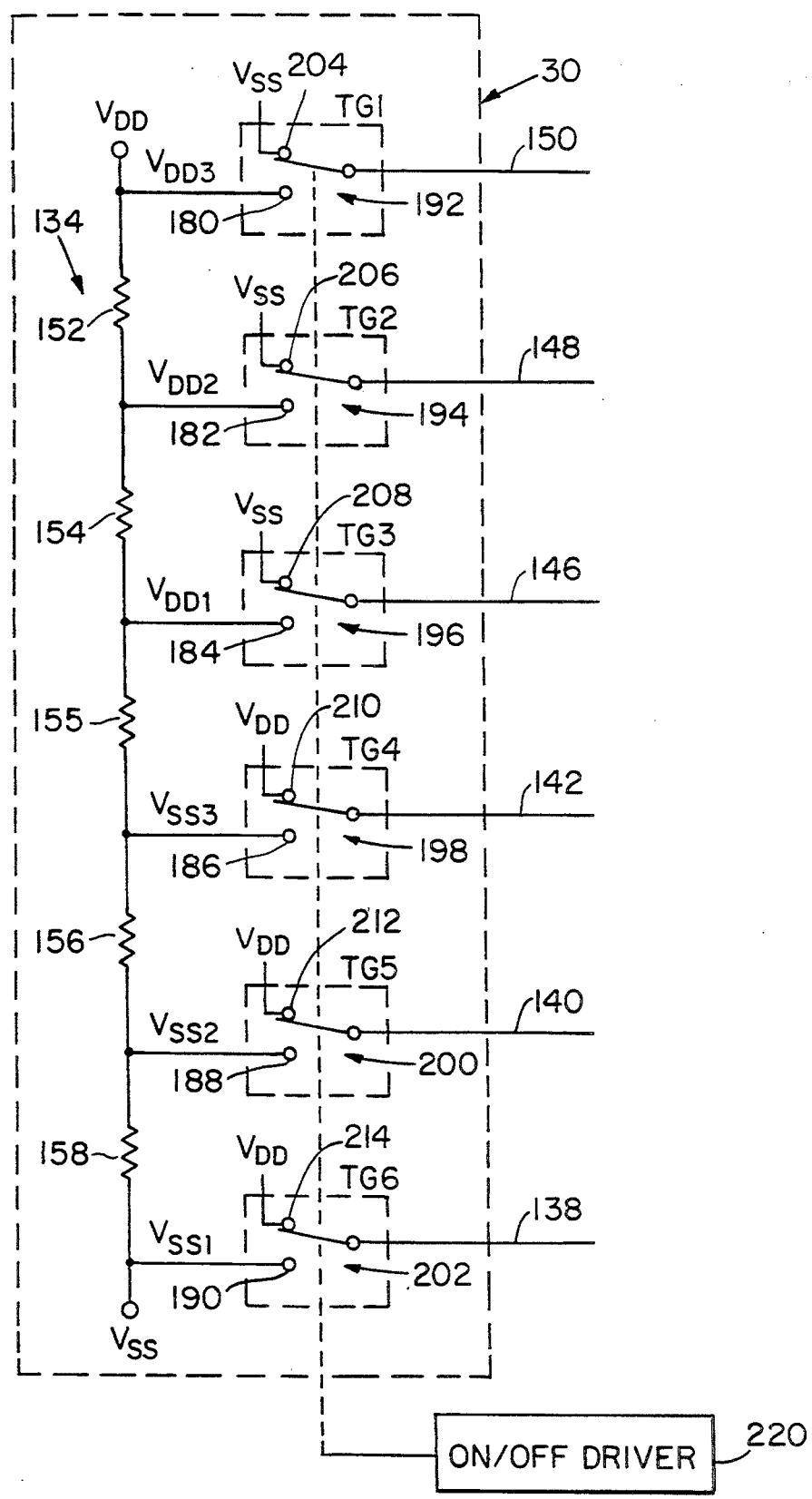
FIG. 3B is a more detailed schematic of the control circuit of FIG. 3A.

Control circuit 30, FIG. 3B, includes a voltage divider 134 including resistors 152, 154, 155, 156 and 158 which are connected to the "on" contacts 180, 182, 184, 186, 188 and 190 of transmission gates 192, 194, 196, 198, 200 and 202. The "off" contacts 204, 206 and 208 corresponding to the "N" channel lines 146, 148 and 150 are all connected to the same negative voltage $V_{SS}$ while the "off" contacts 210, 212 and 214 corresponding to the "P" channels 138, 140, 142 are all connected to the same positive voltage $V_{DD}$. Transmission gates 192–202 may be semiconductor devices such as shown in FIG. 1 where a simple ON/OFF switch is shown and may be operated by a switching signal from an ON/OFF driver 220.

Figure 4:
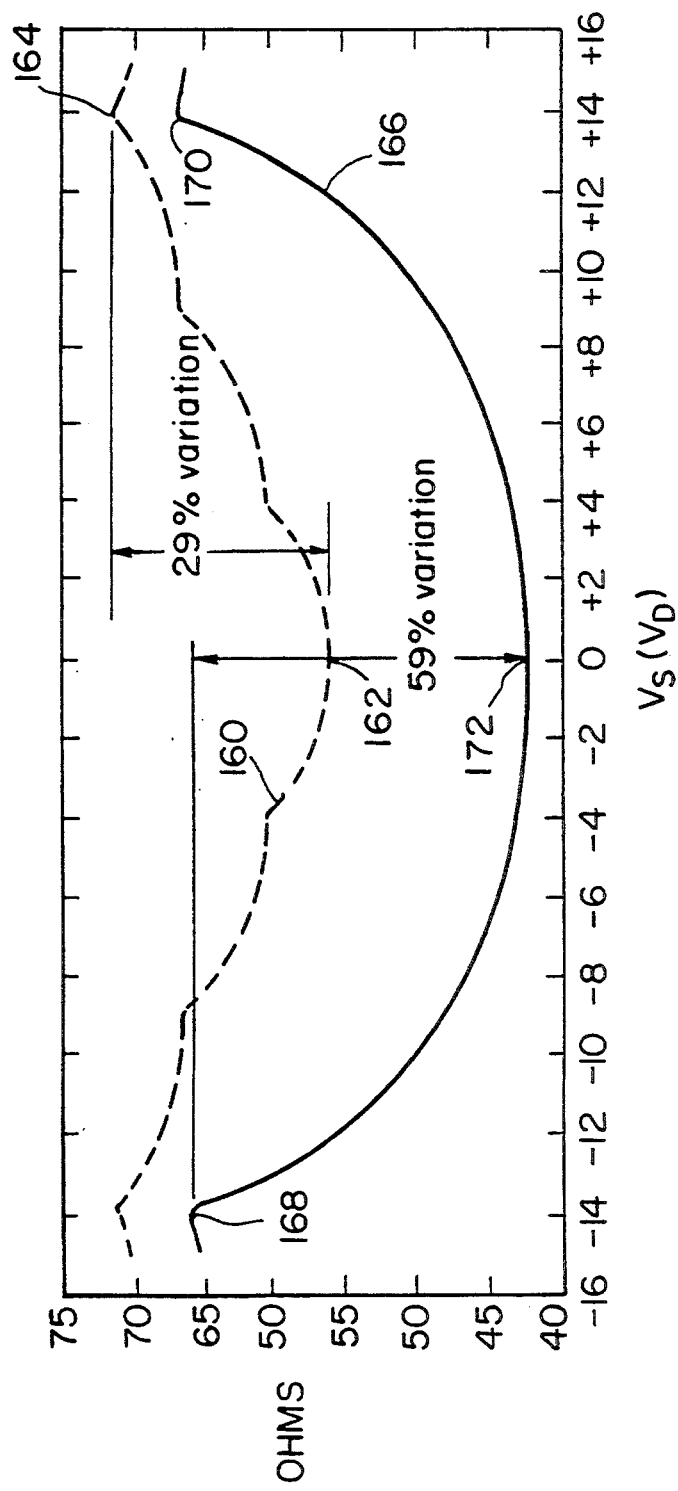
FIGS. 4, 5 and 6 are graphs of resistance versus signal voltage for conventional single transistor devices and for the multiple transistor differentially driven devices of this invention.
Figure 5:
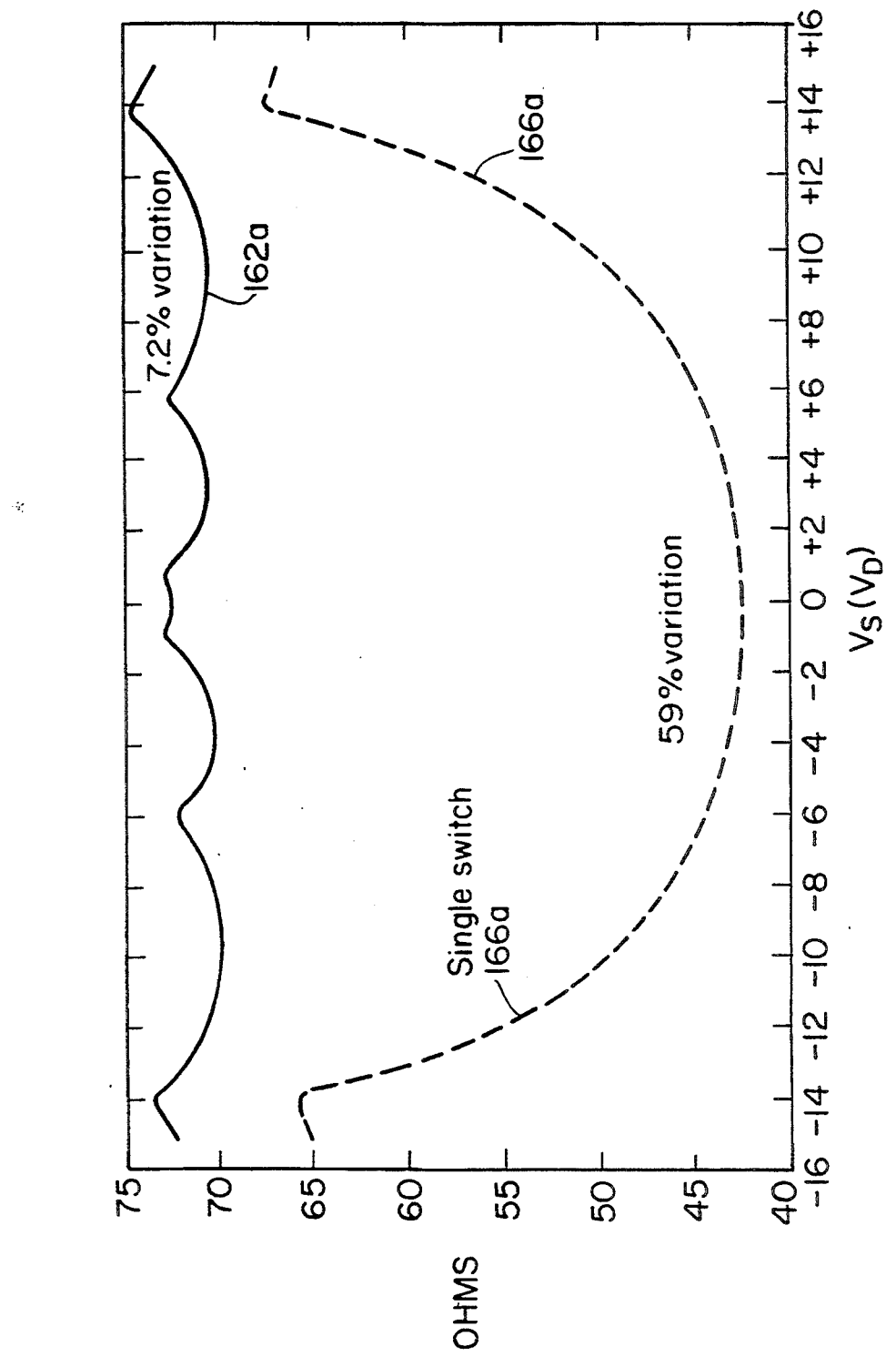
Figure 6:
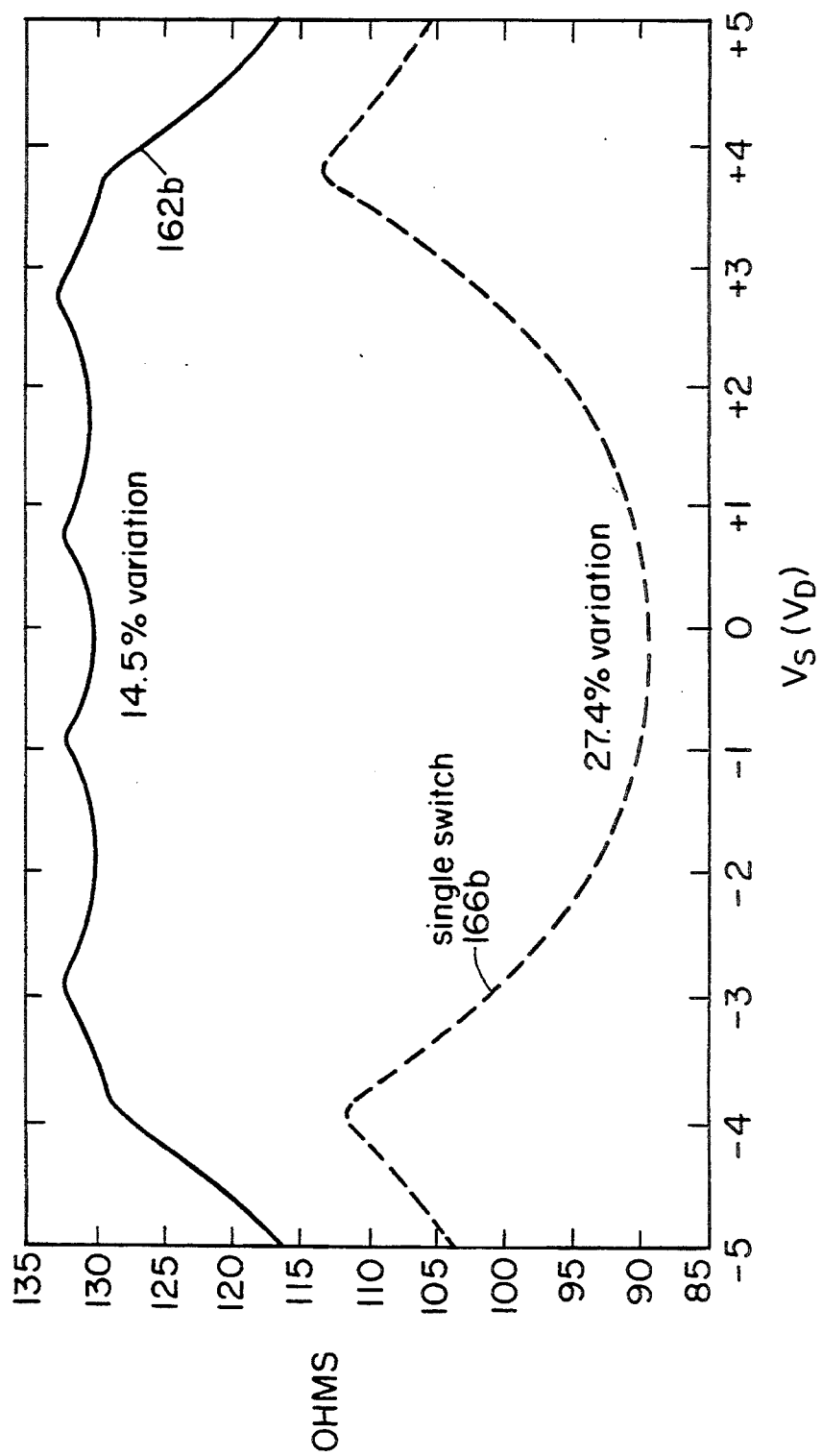

In FIG. 4, where the voltages on lines 138, 140 and 142 are +15, +10 and +5, and the voltages on lines 146, 148 and 150 are −5 volts, −10 volts and −15 volts, the $R_{ON}$ characteristic 160, FIG. 4, shows only a 29% variation in resistance from the low point 162 at approximately 56Ω to the high point at 164 of approximately 72Ω. In contrast, the $R_{ON}$ characteristic of a conventional single switch construction is shown at 166 as having a 59% variation between its peak values approximately 66Ω at points 168 and 170, and the low point 172 in the dip of approximately 42Ω. Similar curves 162a and 166a are shown in FIG. 5, where the voltage on lines 138, 140 and 142 are +15 volts, +7 volts and +2 volts, whereas the voltage on lines 146, 148 and 150 are −2 volts, −7 volts and −15 volts. This biasing arrangement gives an even more improved $R_{ON}$, as indicated by characteristic 162a, where the variation is only 7.2% as opposed to the 59% variation for a single switch configuration indicated at 166a. When the voltages on lines 138, 140 and 142 are reduced to +5 volts, +4 volts and +2 volts, and the voltages on lines 146, 148 and 150 are reduced to −2 volts, −4 volts and −5 volts, the characteristic 162b, FIG. 6, according to this invention, with a 14.5% variation is still superior to the single switch characteristic $R_{ON}$ 166b, which has a 27.4% variation.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A load distortion CMOS switch system comprising:
    a plurality of N-channel and a plurality of P-channel transistors, each having a gate, a source and a drain, with their drain and source terminals connected in parallel for receiving an input signal varying over a predetermined range to be switched; and
    a control circuit for providing a different positive drive voltage to the gate of each of said N-channel transistors and a different negative drive voltage to the gate of each of said P-channel transistors to produce a substantially uniform on resistance, $R_{ON}$, throughout the range of the switched signal conducted through the drain and source terminals and for providing substantially identical negative drive voltages to the gates of each of said N-channel transistors and substantially identical positive drive voltages to the gates of each of said P-channel transistors to turn off said transistors.

2. The low distortion CMOS switch system of claim 1 in which said control circuit includes a voltage divider circuit for providing said different positive and negative voltages for each of said gates of said transistors.

3. The low distortion CMOS switch system of claim 2 in which said control circuit includes a switching means for applying positive and negative voltages to said gates of said transistors to turn on said transistors and for applying said substantially identical positive and negative voltages to said gates of said transistors to turn off said transistors.

4. A low distortion semiconductor switch system comprising:
 a plurality of N-channel and a plurality of P-channel semiconductors, each semiconductor having a gate, a source, and a drain, with their load terminals connected in parallel for receiving an input signal, varying over a predetermined range, to be switched; and
 a control circuit for providing a different drive voltage to the gate of each of said P-channel and to the gate of each of said N-channel semiconductors to produce a substantially uniform "on" resistance, $R_{ON}$, throughout the range of the switched signal conducted through the load terminals.

5. The low distortion semiconductor switch system of claim 4 in which said semiconductor switch system is a CMOS switch and said semiconductors are transistors with their load terminals being drain and source terminals.

6. The low distortion semiconductor switch system of claim 4 in which said control circuit includes a voltage divider circuit for providing different positive and negative voltages for each of said gates of said transistors.

7. The low distortion semiconductor switch system of claim 6 in which said control circuit includes a switching means for applying positive and negative voltages to said gates of transistors to turn on said transistors and for applying said substantially identical positive and negative voltages to said gates of said transistors to turn off said transistors.

* * * * *